United States Patent
Tang et al.

(10) Patent No.: US 11,041,765 B2
(45) Date of Patent: Jun. 22, 2021

(54) TEMPERATURE SENSOR AND MODULATION CIRCUIT FOR VOLTAGE TO DUTY-CYCLE CONVERSION OF THE SAME

(71) Applicant: HANGZHOU VANGO TECHNOLOGIES, INC., Zhejiang (CN)

(72) Inventors: Zhong Tang, Zhejiang (CN); Yun Fang, Zhejiang (CN); Xiaopeng Yu, Zhejiang (CN); Zheng Shi, Zhejiang (CN); Nick Nianxiong Tan, Zhejiang (CN)

(73) Assignee: HANGZHOU VANGO TECHNOLOGIES, INC., Zhejiang (CN)

( * ) Notice: Subject to any disclaimer, the term of this patent is extended or adjusted under 35 U.S.C. 154(b) by 343 days.

(21) Appl. No.: 16/288,127

(22) Filed: Feb. 28, 2019

(65) Prior Publication Data

US 2020/0278261 A1 Sep. 3, 2020

(51) Int. Cl.
*G01K 7/34* (2006.01)
*H03K 5/08* (2006.01)
*H03K 5/24* (2006.01)

(52) U.S. Cl.
CPC ............ *G01K 7/34* (2013.01); *H03K 5/08* (2013.01); *H03K 5/24* (2013.01)

(58) Field of Classification Search
None
See application file for complete search history.

(56) References Cited

U.S. PATENT DOCUMENTS

| 7,075,353 | B1* | 7/2006 | Wan | G06F 1/04 |
| | | | | 327/295 |
| 2015/0109835 | A1* | 4/2015 | Xu | H02H 3/202 |
| | | | | 363/50 |
| 2017/0016776 | A1* | 1/2017 | Ma | H03K 17/687 |
| 2019/0268193 | A1* | 8/2019 | Rapina | H04L 27/1566 |

OTHER PUBLICATIONS

Tang, Zhong, et al.,Capacitor-reused CMOS temperature sensor with duty-cycle-modulated output and 0.38oC (3σ) inaccuracy, Electronics Letters, May 3, 2018, vol. 54 No. 9, pp. 568-570.

(Continued)

*Primary Examiner* — Cassandra F Cox
(74) *Attorney, Agent, or Firm* — Yue (Robert) Xu; Apex Attorneys at Law, LLP

(57) ABSTRACT

A modulation circuit for voltage to duty-cycle conversion is provided. A first input end and a second input end of a comparator are supplied with a first voltage and a second voltage via a first switch and a second switch respectively. An output end of the comparator outputs a comparison result signal. A charging end of a charging capacitor is connected with a charging current source and a grounding reset module, and is connected with the first input end via a third switch, and is connected with the second input end via a fourth switch. When the comparison result signal flips over, a control module controls the grounding reset module to switch an on-off state of a first switch group including the first switch and the fourth switch and a second switch group including the second switch and the third switch.

12 Claims, 6 Drawing Sheets

(56) References Cited

OTHER PUBLICATIONS

Zhu, Di, et al., High Accuracy Time-Mode Duty-Cycle-Modulation-Based Temperature Sensor for Energy Efficient System Applications, International Symposium on Integrated Circuits (ISIC), 2014, pp. 400-403.

Wang, Guijie, et al., An Accurate BJT-Based CMOS Temperature Sensor With Duty-Cycle-Modulated Output, IEEE Transactions on Industrial Electronics, Feb. 2017, vol. 64, No. 2, pp. 1572-1580.

Pertijs, Michiel A. P., et al., A CMOS Smart Temperature Sensor With a 3σ Inaccuracy of ±0.5oC From -50oC to 120oC, IEEE Journal of Solid-State Circuits, Feb. 2005, vol. 40, No. 2, pp. 454-461.

* cited by examiner

TEMPERATURE SENSOR AND MODULATION CIRCUIT FOR VOLTAGE TO DUTY-CYCLE CONVERSION OF THE SAME

FIELD

The present disclosure relates to the technical field of microelectronics, in particular to a temperature sensor and a modulation circuit for voltage to duty-cycle conversion of the temperature sensor.

BACKGROUND

Complementary Metal Oxide Semiconductor (CMOS) temperature sensors have been widely used, for example, the CMOS temperature sensor may be used in a Real Time Clock (RTC) clock generation circuit in a System on Chip (SoC). In a conventional CMOS temperature sensor, bipolar transistors are used as temperature sensing devices in an analog front-end circuit, which generates an electrical signal that is positively correlated with temperature, and a quantized high accuracy temperature value is outputted by a high accuracy Analog-to-Digital Converter (ADC). As a result, such high accuracy ADC increases the design complexity and the cost of the conventional CMOS temperature sensor. Recently, a temperature detection scheme based on duty-cycle-modulated output has been proposed in the conventional technology. In the temperature detection scheme based on duty-cycle-modulated output, a comparator is used to compare a charging voltage of a capacitor with a temperature correlated voltage, thereby outputting a square wave signal with a duty-cycle related to temperature. However, in the existing scheme, two capacitors are generally used, a charging voltage of one capacitor is compared with a voltage positively correlated with temperature, and a charging voltage of the other capacitor is compared with a voltage negatively correlated with temperature, therefore a chip area in the circuit is large, and a matching degree of two capacitance values of the two capacitors also affects an overall detection accuracy. In view of this, it is an urgent need for those skilled in the art to provide a scheme to solve the above technical problems.

SUMMARY

A temperature sensor and a modulation circuit for voltage to duty-cycle conversion of the temperature sensor are provided in the present disclosure to effectively reduce the chip area in the circuit and ensure the detection accuracy.

In order to solve the above technical problem, in a first aspect, a modulation circuit for voltage to duty-cycle conversion is provided according to the disclosure. The modulation circuit includes: a comparison module including a comparator; a charging module including a charging capacitor and a charging current source; a grounding reset module; a switch module including a first switch, a second switch, a third switch and a fourth switch; and a control module.

A first input end of the comparator is connected with a first end of the first switch, a second end of the first switch is supplied with a first voltage. A second input end of the comparator is connected with a first end of the second switch, a second end of the second switch is supplied with a second voltage. An output end of the comparator serves as an output end of the modulation circuit, the output end of the comparator is configured to output a comparison result signal. A charging end of the charging capacitor is connected with the charging current source and the grounding reset module. The charging end of the charging capacitor is connected with the first input end of the comparator via the third switch. The charging end of the charging capacitor is connected with the second input end of the comparator via the fourth switch.

The control module is configured to, when the comparison result signal flips over, control the grounding reset module to operate to make the charging capacitor be connected to ground and be reset, and switch an on-off state of a first switch group and an on-off state of a second switch group. The first switch group includes the first switch and the fourth switch. The second switch group includes the second switch and the third switch.

In an embodiment, the first input end of the comparator is a non-inverting input end, and the second input end of the comparator is an inverting input end. The control module is configured to control the on-off state of the first switch group according to the comparison result signal, and control the on-off state of the second switch group according to an inverting signal of the comparison result signal.

In a second aspect, a temperature sensor is provided according to the disclosure. The temperature sensor includes a temperature correlated voltage generating circuit and the modulation circuit for voltage to duty-cycle conversion described above. The temperature correlated voltage generating circuit includes: a first voltage module configured to output the first voltage; and a second voltage module configured to output the second voltage. The first voltage is positively correlated with temperature, the second voltage is negatively correlated with temperature. The control module is further configured to generate a temperature detection signal according to a duty-cycle of the comparison result signal and output the temperature detection signal.

In an embodiment, the control module is configured to generate a temperature detection signal μ according to $$\mu = \frac{kD}{kD + 1 - D}$$

and output the temperature detection signal. D is the duty-cycle of the comparison result signal, and k is an adjustment parameter.

In an embodiment, the first voltage module includes a first Proportional to Absolute Temperature (PTAT) current source and a bias resistor connected in series. The first voltage is a voltage across two ends of the bias resistor. The second voltage module includes a second PTAT current source and a bias bipolar junction transistor connected in series. The second voltage is a base-emitter voltage of the bias bipolar junction transistor. The temperature correlated voltage generating circuit further includes a PTAT current generating circuit configured to provide a first PTAT current for the first PTAT current source and provide a second PTAT current for the second PTAT current source.

In an embodiment, the first PTAT current source is connected with a first end of the bias resistor and the second end of the first switch, and a second end of the bias resistor is connected to ground. The second PTAT current source is connected with an emitter of the bias bipolar junction transistor and the second end of the second switch, and a base and a collector of the bias bipolar junction transistor are connected to ground.

In an embodiment, the first PTAT current source is connected with the first end of the first switch, a first end of the bias resistor is connected with the second end of the first switch, and a second end of the bias resistor is connected to ground.

The second PTAT current source is connected with the first end of the second switch, an emitter of the bias bipolar junction transistor is connected with the second end of the second switch, and a base and a collector of the bias bipolar junction transistor is connected to ground.

The charging current source includes a first charging current source and a second charging current source. The first PTAT current source serves as the first charging current source to charge the charging capacitor when the third switch is turned on. The second PTAT current source serves as the second charging current source to charge the charging capacitor when the fourth switch is turned on. The first PTAT current is equal to the second PTAT current.

In an embodiment, the first voltage module further includes a third PTAT current source connected with the second end of the first switch.

In an embodiment, the second voltage module further includes a compensation bipolar junction transistor and a compensation current source. The compensation current source is connected with an emitter of the compensation bipolar junction transistor. A collector of the compensation bipolar junction transistor is connected to ground. A base of the compensation bipolar junction transistor is connected with the emitter of the bias bipolar junction transistor. The compensation bipolar junction transistor is configured to perform gain compensation on the bias bipolar junction transistor.

In an embodiment, the PTAT current generating circuit includes a current mirror module, an operational amplifier, a first resistor, a first predetermined number of first transistors, and a second predetermined number of second transistors.

A first end of the first resistor is connected with a non-inverting input end of the operational amplifier and is configured to receive a first mirror current outputted from the current mirror module. A second end of the first resistor is connected with an emitter of each of the first transistors.

An emitter of each of the second transistors is connected with an inverting input end of the operational amplifier and is configured to receive a second mirror current outputted from the current mirror module. A base and a collector of each of the first transistors are connected to ground. A base and a collector of each of the second transistors are connected to ground. The current mirror module is configured to provide the first PTAT current and the second PTAT current.

In an embodiment, the comparison module further includes a first chopper configured to chop an input signal of the comparator, and a second chopper configured to chop an output signal of the comparator. The PTAT current generating circuit further includes a third chopper configured to chop an input signal of the operational amplifier, and a fourth chopper configured to chop an output signal of the operational amplifier. The control module is further configured to generate a chopping control clock signal according to the comparison result signal and output the chopping control clock signal to the first chopper, the second chopper, the third chopper and the fourth chopper.

In an embodiment, the PTAT current generating circuit further includes a second switching switch group connected with the current mirror module and a first switching switch group. The second end of the first resistor is connected with the emitters of the first transistors via the first switching switch group. The inverting input end of the operational amplifier is connected with the emitters of the second transistors via the first switching switch group.

The control module is further configured to generate a dynamic element matching (DEM) control clock signal according to the comparison result signal and output the DEM control clock signal to the first switching switch group and the second switching switch group, to perform dynamic element matching control on the first transistors, the second transistors and the current mirror module.

The modulation circuit for voltage to duty-cycle conversion according to the disclosure includes: a comparison module, a charging module, a grounding reset module, a switch module and a control module. The comparison module includes a comparator. The switch module includes a first switch, a second switch, a third switch and a fourth switch. A first input end of the comparator is connected with a first end of the first switch, a second end of the first switch is supplied with a first voltage. A second input end of the comparator is connected with a first end of the second switch, a second end of the second switch is supplied with a second voltage. An output end of the comparator serves as an output end of the modulation circuit, the output end of the comparator is configured to output a comparison result signal. The charging module includes a charging capacitor and a charging current source. A charging end of the charging capacitor is connected with the charging current source and the grounding reset module. The charging end of the charging capacitor is connected with the first input end of the comparator via the third switch. The charging end of the charging capacitor is connected with the second input end of the comparator via the fourth switch. The control module is configured to, when the comparison result signal flips over, control the grounding reset module to operate to make the charging capacitor be connected to ground and be reset, and switch an on-off state of a first switch group and an on-off state of a second switch group. The first switch group includes the first switch and the fourth switch. The second switch group includes the second switch and the third switch.

It can be seen that, in the present disclosure, the charging end of the charging capacitor is connected with the non-inverting input end and the inverting input end of the comparison module via two switches respectively. With a reasonable switch control, the capacitor voltage of the charging capacitor can be compared with different voltage in different comparison phases, thereby realizing the reuse of the same charging capacitor in different comparison phases, and reducing the number of used charging capacitors and the chip area, and saving product cost and circuit layout space. Moreover, in this disclosure, inaccurate detection, caused by the mismatch of capacitance values of two capacitors when two charging capacitors are used, is effectively avoided, thereby improving the detection accuracy. Further, in the disclosure, there is no strict requirement of the capacitance value of the used capacitor, a Metal Oxide Semiconductor (MOS) capacitor with a larger capacitance density may be used, thereby further reducing the chip area. The temperature sensor provided in the present disclosure includes the above-mentioned modulation circuit for voltage to duty-cycle conversion, therefore, the temperature sensor also has the above advantageous effects.

BRIEF DESCRIPTION OF THE DRAWING

In order to describe technical solutions of embodiments in the present disclosure and of the conventional technology more clearly, drawings required in the description of the conventional technology and the embodiments of the present disclosure are introduced simply as follows. Certainly, the following drawings of the embodiments of the disclosure show only partial embodiments of the present disclosure, and those skilled in the art can obtain other drawings in accordance with the provided drawings without any creative work, the obtained other drawings are also fall into the scope of protection of the present disclosure.

DETAILED DESCRIPTION OF THE EMBODIMENTS

A temperature sensor and a modulation circuit for voltage to duty-cycle conversion of the temperature sensor are provided according to the present disclosure, to effectively reduce the chip area in the circuit and ensure the detection accuracy. For a more clear and complete description of the technical solutions in the embodiments of the present disclosure, the technical solutions in the embodiments of the present disclosure will be described below in accordance with the drawings in the embodiments of the present disclosure. Apparently, the described embodiments are only a portion of rather than all of the embodiments of the present disclosure. All the other embodiments obtained by those skilled in the art based on the embodiments in the present disclosure without any creative work fall into the protection scope of the present disclosure.

Figure 1:
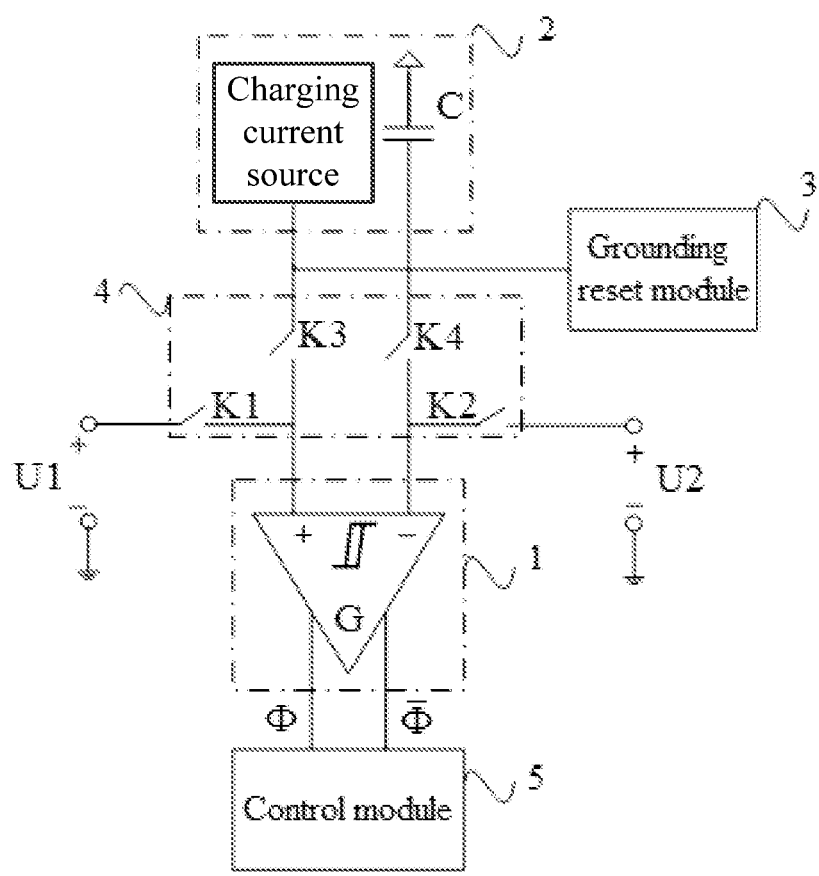
FIG. 1 is a circuit structural diagram of a modulation circuit for voltage to duty-cycle conversion according to an embodiment of the present disclosure.

A modulation circuit for voltage to duty-cycle conversion is provided in the embodiment of the present disclosure. Referring to FIG. 1, the modulation circuit includes a comparison module 1, a charging module 2, a grounding reset module 3, a switch module 4, and a control module 5. The comparison module 1 includes a comparator G. The switch module 4 includes a first switch K1, a second switch K2, a third switch K3 and a fourth switch K4.

A first input end of the comparator G is connected with a first end of the first switch K1, a second end of the first switch K1 is supplied with a first voltage. A second input end of the comparator G is connected with a first end of the second switch K2, a second end of the second switch K2 is supplied with a second voltage. An output end of the comparator G serves as an output end of the modulation circuit, the output end of the comparator G is configured to output a comparison result signal. The charging module 2 includes a charging capacitor C and a charging current source. A charging end of the charging capacitor C is connected with the charging current source and the grounding reset module 3. The charging end of the charging capacitor C is connected with the first input end of the comparator G via the third switch K3. The charging end of the charging capacitor C is connected with the second input end of the comparator G via the fourth switch K4.

The control module 5 is configured to, when the comparison result signal flips over, control the grounding reset module 3 to operate to make the charging capacitor C be connected to ground and be reset, and switch an on-off state of a first switch group and an on-off state of a second switch group. The first switch group includes the first switch K1 and the fourth switch K4, and the second switch group includes the second switch K2 and the third switch K3.

In the modulation circuit for voltage to duty-cycle conversion according to the present disclosure, a charging process of a capacitor and switch control are used to achieve modulated output of two input voltages, that is, a first voltage and a second voltage, in a duty-cycle manner. The charging end of the charging capacitor C is connected with the charging current source, the voltage of the charging end increases during the charging process. By switching on-off states of different switch groups, the voltage of the charging end can be repeatedly compared with the first voltage and the second voltage, respectively, thereby obtaining a periodic comparison result signal having a certain duty-cycle.

In an embodiment, referring to FIG. 1, the first input end of the comparator G is a non-inverting input end, and the second input end of the comparator G is an inverting input end. The control module 5 is configured to control the on-off state of the first switch group according to the comparison result signal, and control the on-off state of the second switch group according to an inverting signal of the comparison result signal. In FIG. 1, $\Phi$ is the comparison result signal outputted from the comparator G, $\overline{\Phi}$ is an inverting signal of the comparison result signal.

It should be noted that, similar to FIG. 1, those skilled in the art can also obtain a following alternative solution. The first input end of the comparator G is an inverting input end, the second input end of the comparator G is a non-inverting input end, the control module 5 is configured to control the on-off state of the second switch group according to the comparison result signal, and control the on-off state of the first switch group according to the inverting signal of the comparison result signal. The alternative solution also falls into the protection scope of the present disclosure.

The operation process of the modulation circuit for voltage to duty-cycle conversion provided in the present disclosure is described by taking the modulated circuit shown in FIG. 1 as an example. The operation process includes following two phases.

In a first phase, the control module 5 controls the first switch K1 and the fourth switch K4 to be turned on, the non-inverting input end of the comparator G is supplied with the first voltage U1 via the first switch K1, the inverting input end of the comparator G is connected with the charging capacitor C via the fourth switch K4. In this case, the voltage of the non-inverting input end of the comparator G is the first voltage U1, and the voltage of the inverting input end of the comparator G is the capacitor voltage Vc of the charging capacitor. At the initial charging time, the control module 5 controls the grounding reset module 3 to operate to make the charging capacitor C be connected to ground and be reset, and Vc=0. During the charging process, the capacitor voltage Vc increases from 0 continuously. As long as the capacitor voltage Vc of the inverting input end is less than the first voltage U1 of the non-inverting input end, the comparison result signal outputted from the comparator G is always a high level, the first switch K1 and the fourth switch K4 remain in a turn-on state. Once the capacitor voltage Vc is greater than the first voltage U1, the comparison result signal outputted from the comparator G flips over, that is, the comparison result signal becomes a low level, then the first switch K1 and the fourth switch K4 are turned off.

The control module 5 controls the on-off state of the second switch K2 and the third switch K3 according to an inverting signal of the comparison result signal outputted from the comparator G. When the comparison result signal becomes a low level, the second switch K2 and the third switch K3 are turned on, that is, a second phase is entered. At this time, the inverting input end of the comparator G is supplied with the second voltage U2 via the second switch K2, and the non-inverting input end of the comparator G is connected with the charging capacitor C via the third switch K3. In this case, the voltage of the inverting input end of the comparator G is the second voltage U2, and the voltage of the non-inverting input end of the comparator G is the capacitor voltage Vc. When the comparison result signal changes from the high level to the low level, the control module 5 controls the grounding reset module 3 to operate, the charging capacitor C is connected to ground and reset, and the capacitor voltage is becomes Vc=0. Then, as the charging capacitor C is charged continuously, the capacitor voltage Vc increases from 0 continuously. As long as the capacitor voltage Vc of the non-inverting input end is less than the second voltage U2 of the inverting input end, the comparison result signal outputted from the comparator G is always a low level, the second switch K2 and the third switch K3 remain in a turn-on state. Once the capacitor voltage Vc is greater than the second voltage U2, the comparison result signal outputted from the comparator G flips over, that is, the comparison result signal becomes a high level, and the second switch K2 and the third switch K3 are turned off, that is, the first phase, in which the first switch K1 and the fourth switch K4 are turned on, is entered.

The grounding reset module 3 may be a normally open grounding switch S. The control module 5 controls the grounding switch S to be turned on quickly and then to be turned off, to complete the grounding and reset of the charging capacitor C, when the comparison result signal outputted from the comparator G flips over.

Figure 2:
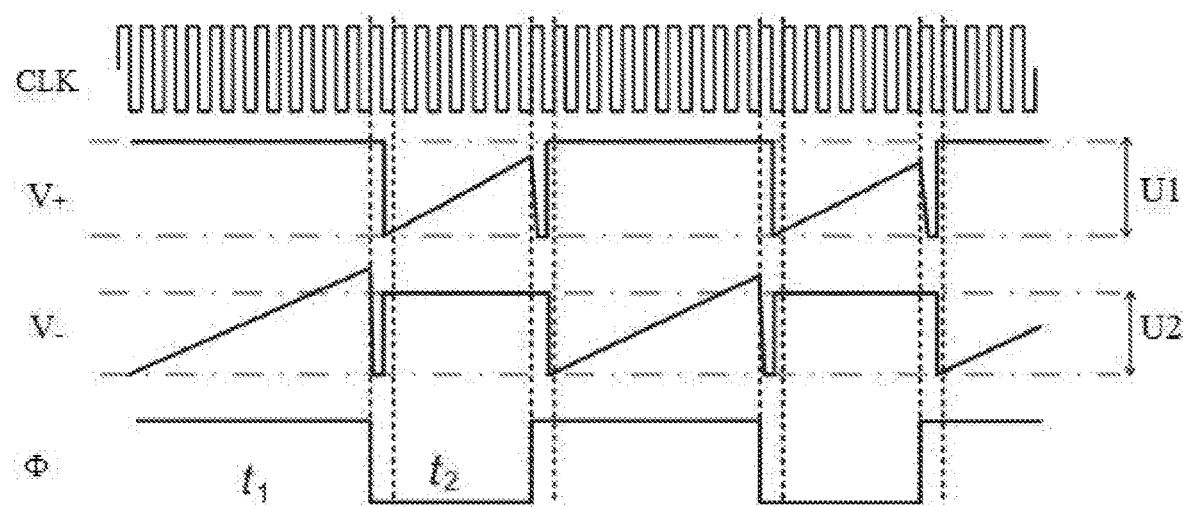
FIG. 2 is an operation waveform diagram of the modulation circuit for voltage to duty-cycle conversion shown in FIG. 1.

It can be seen from the above content that, a duration t1 of the first phase is actually the charging duration required for the capacitor voltage Vc to be charged from 0 to the first voltage U1, and the duration t2 of the second phase is actually the charging duration required for the capacitor voltage Vc to be charged from 0 to the second voltage U2. Referring to FIG. 2, FIG. 2 is an operation waveform diagram of the modulation circuit for voltage to duty-cycle conversion according to the present disclosure. In FIG. 2, CLK is a clock pulse signal of the control module 5, $V_+$ is the voltage of the non-inverting input end of the comparator G, $V_-$ is the voltage of the inverting input end of the comparator G; $\Phi$ is the comparison result signal. $U1/(U1+U2)=t1/(t1+t2)=D$, D is the duty-cycle of the comparison result signal outputted from the comparator G.

It can be seen from the above two phases of the operation process and FIG. 1 that, the modulation circuit for voltage to duty-cycle conversion provided in the present disclosure realizes reuse of the charging capacitor, therefore only one charging capacitor C is needed. Specifically, the same charging capacitor C can be charged in the first phase and the second phase to complete modulation for voltage to duty-cycle conversion by reasonably switching the on-off state of the first switch group and the on-off state of the second switch group.

The modulation circuit for voltage to duty-cycle conversion according to the present disclosure includes a comparison module 1, a charging module 2, a grounding reset module 3, a switch module 4, and a control module 5. The comparison module 1 includes a comparator G. The switch module 4 includes a first switch K1, a second switch K2, a third switch K3 and a fourth switch K4. A first input end of the comparator G is connected with a first end of the first switch K1, a second end of the first switch K1 is supplied with a first voltage. A second input end of the comparator G is connected with a first end of the second switch K2, a second end of the second switch K2 is supplied with a second voltage. An output end of the comparator G serves as an output end of the modulation circuit, the output end of the comparator G is configured to output a comparison result signal. The charging module 2 includes a charging capacitor C and a charging current source. A charging end of the charging capacitor C is connected with the charging current source and the grounding reset module 3. The charging end of the charging capacitor C is connected with the first input end of the comparator G via the third switch K3. The charging end of the charging capacitor C is connected with the second input end of the comparator G via the fourth switch K4. The control module 5 is configured to, when the comparison result signal flips over, control the grounding reset module 3 to operate to make the charging capacitor C be connected to ground and be reset, and switch an on-off state of a first switch group and an on-off state of a second switch group. The first switch group includes the first switch K1 and the fourth switch K4, and the second switch group includes the second switch K2 and the third switch K3.

It can be seen that, in the present disclosure, the charging end of the charging capacitor C is connected with two input ends of the comparison module 1 via two switches respectively. With a reasonable switch control, the capacitor voltage Vc of the charging capacitor C can be compared with different voltage in different comparison phases, thereby realizing the reuse of the same charging capacitor in different comparison phases, and reducing the number of used charging capacitors and the chip area, and saving product cost and circuit layout space. Moreover, in this disclosure, inaccurate detection, caused by the mismatch of capacitance values of two capacitors when two charging capacitors are used, is effectively avoided, thereby improving the detection accuracy. Further, in the disclosure, only one charging capacitor is used, there is no strict requirement of the capacitance value of the used capacitor, a Metal Oxide Semiconductor (MOS) capacitor with a larger capacitance density may be used, thereby further reducing the chip area.

In addition, the modulation circuit for voltage to duty-cycle conversion provided in the present disclosure is implemented based on the comparator G without using an operational amplifier with relatively high power consumption, thereby effectively reducing circuit power consumption.

The temperature sensor provided in the present disclosure is described below.

The temperature sensor provided in the present disclosure includes a temperature correlated voltage generating circuit and the modulation circuit for voltage to duty-cycle conversion according to any one of the above embodiments. The temperature correlated voltage generating circuit includes: a first voltage module configured to output the first voltage U1; and a second voltage module configured to output the second voltage U2. The first voltage U1 is positively correlated with temperature, the second voltage U2 is negatively correlated with temperature. The control module 5 is further configured to generate a temperature detection signal according to a duty-cycle of the comparison result signal and output the temperature detection signal.

In an embodiment, the modulation circuit for voltage to duty-cycle conversion described above is applied to temperature detection. The first voltage U1 outputted from the first voltage module is positively correlated with temperature. The second voltage U2 outputted from the second voltage module is negatively correlated with temperature. Therefore, the ratio U1/(U1+U2) is also correlated with temperature and can reflect temperature information. Therefore, the temperature detection can be achieved in the present disclosure by using the duty-cycle D of the comparison result signal outputted from the comparator G.

It can be seen that, in the temperature sensor according to the present disclosure, the charging end of the charging capacitor C is connected with two input ends of the comparison module 1 via two switches respectively. With a reasonable switch control, the capacitor voltage Vc of the charging capacitor C can be compared with different voltage in different comparison phases, thereby realizing the reuse of the same charging capacitor in different comparison phases, and reducing the number of used charging capacitors and the chip area, and saving product cost and circuit layout space. Moreover, in this disclosure, inaccurate detection, caused by the mismatch of capacitance values of two capacitors when two charging capacitors are used, is effectively avoided, thereby improving the detection accuracy. Further, in the disclosure, only one charging capacitor is used, there is no strict requirement of the capacitance value of the used capacitor, a Metal Oxide Semiconductor (MOS) capacitor with a larger capacitance density may be used, thereby further reducing the chip area.

In addition, in the disclosure, the use of the operational amplifier with relatively high power consumption is reduced effectively, thereby effectively reducing circuit power consumption.

In a preferred embodiment of the temperature sensor provided in the present disclosure, the control module 5 is configured to generate a temperature detection signal µ according to $$\mu = \frac{kU1}{kU1+U2} = \frac{kD}{kD+1-D}$$

and output the temperature detection signal.

It can be seen from the above content that, those skilled in the art can directly obtain the temperature according to the duty-cycle D of the comparison result signal. In addition, parameter adjustment can be performed on basis of the duty-cycle D, and a variable µ that is more linear with temperature can be obtained by introducing the adjustment parameter k, $$\mu = \frac{kU1}{kU1+U2} = \frac{kD}{kD+1-D} = \frac{kY}{kY+1}$$

Y=U1/U2. The selection criterion of the adjustment parameter k is to make the temperature positively correlated coefficient of k·U1 and the temperature negatively correlated coefficient of U2 completely counteract with each other, so that k·U1+U2 does not change with the change of temperature, in this way, the correlation between the obtained variable µ and temperature depends on U1, that is, the variable µ has a good positive correlation.

In a preferred embodiment of the temperature sensor provided in the present disclosure, the first voltage module includes a first Proportional to Absolute Temperature (PTAT) current source E1 and a bias resistor Rp connected in series. The first voltage U1 is a voltage across two ends of the bias resistor Rp. The second voltage module includes a second PTAT current source E2 and a bias bipolar junction transistor Qp connected in series. The second voltage U2 is a base-emitter voltage of the bias bipolar junction transistor Qp. The temperature correlated voltage generating circuit further includes a PTAT current generating circuit configured to provide a first PTAT current for the first PTAT current source E1 and provide a second PTAT current for the second PTAT current source E2.

In an embodiment, the base-emitter voltage Vbe of the transistor is negatively correlated with temperature, while the difference value ΔVbe between the base-emitter voltages of the transistors with different sizes or different bias currents is positively correlated with temperature. A PTAT current generating circuit based on the above characteristic can generate a PTAT current, thereby providing the first PTAT current for the first PTAT current source E1 to form the first voltage U1 on the bias resistor Rp. Generally, the first voltage may be noted as U1=n·ΔVbe. n depends on the circuit setting in the PTAT current generating circuit and the resistance value of the bias resistor Rp. ΔVbe also depends on the circuit setting in the PTAT current generating circuit. In addition, the base-emitter voltage of the bias bipolar junction transistor Qp may be used to provide the second voltage U2=Vbe.

Figure 3:
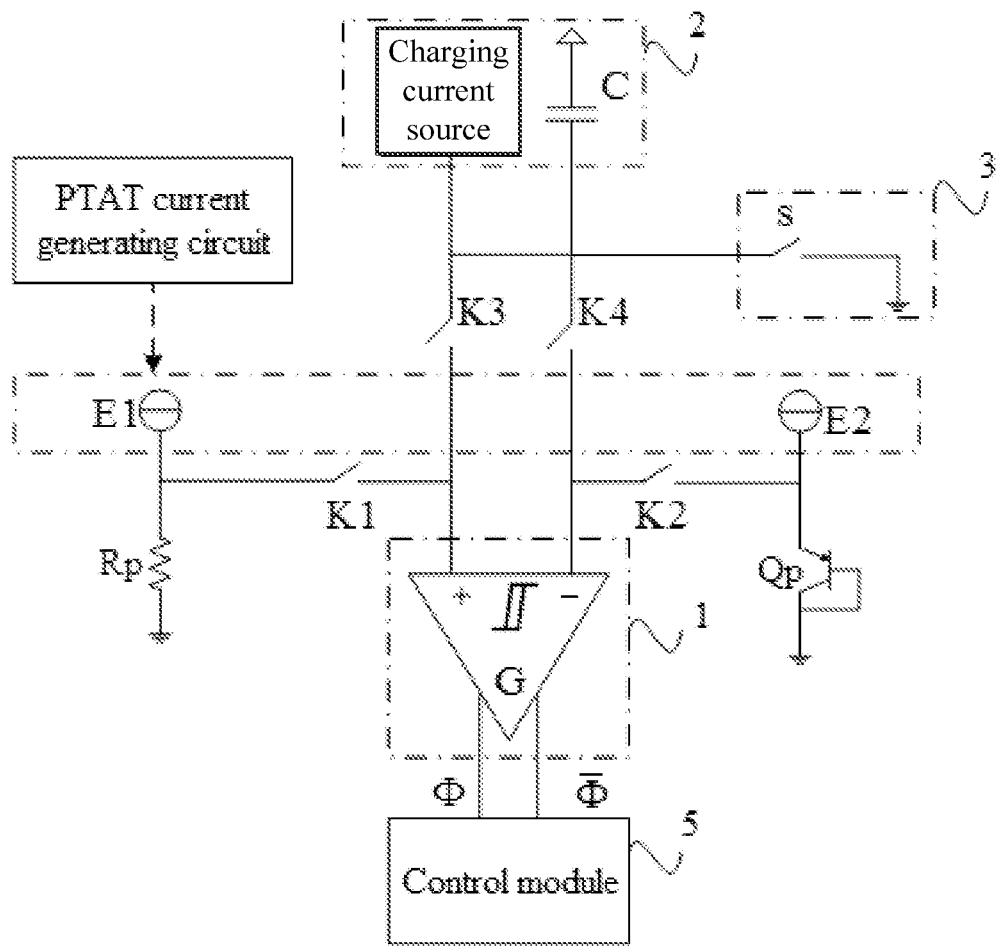
FIG. 3 is a circuit structural diagram of a temperature sensor according to an embodiment of the present disclosure.

Referring to FIGS. 3, FIG. 3 is a circuit structural diagram of a temperature sensor according to an embodiment of the present disclosure.

As a preferred embodiment, in the temperature sensor shown in FIG. 3, the first PTAT current source E1 is connected with a first end of the bias resistor Rp and the second end of the first switch K1, and a second end of the bias resistor Rp is connected to ground. The second PTAT current source E2 is connected with an emitter of the bias bipolar junction transistor Qp and the second end of the second switch K2, and a base and a collector of the bias bipolar junction transistor Qp are connected to ground.

Specifically, as shown in FIG. 3, in this embodiment, the first PTAT current source E1, the second PTAT current source E2, and the charging current source are three different current sources. The first PTAT current source E1 is configured to output the first voltage U1, the second PTAT current source E2 is configured to output the second voltage U2, and the charging current source is configured to charge the charging capacitor C.

Figure 4:
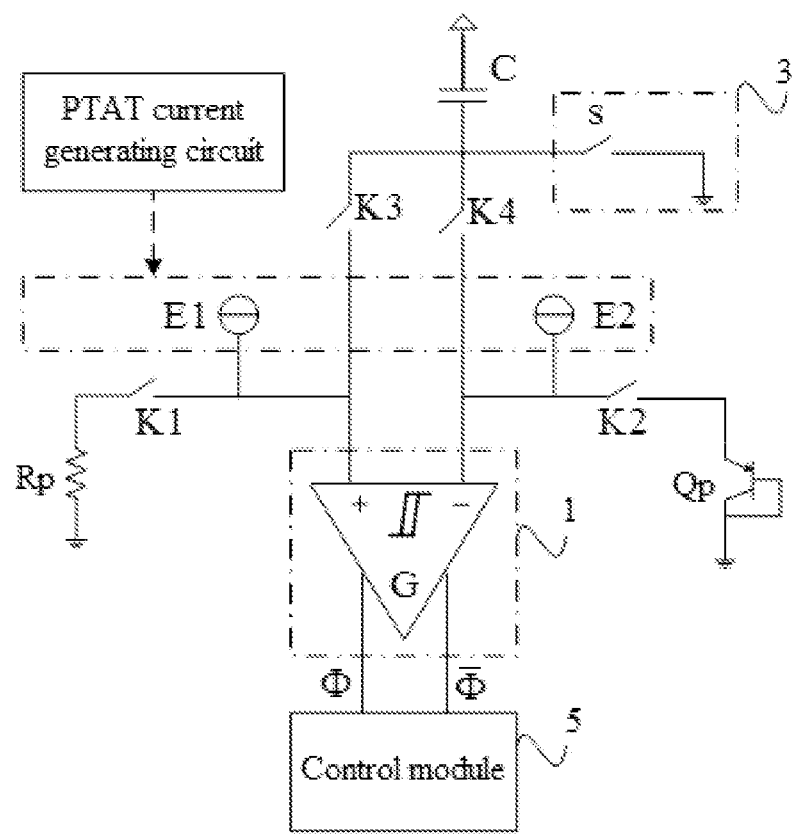
FIG. 4 is a circuit structural diagram of a temperature sensor according to another embodiment of the present disclosure.

Referring to FIG. 4, FIG. 4 is a circuit structural diagram of a temperature sensor according to another embodiment of the present disclosure.

As a preferred embodiment, in the temperature sensor shown in FIG. 4, the first PTAT current source E1 is connected with the first end of the first switch K1, a first end of the bias resistor Rp is connected with the second end of the first switch K1, and a second end of the bias resistor Rp is connected to ground. The second PTAT current source E2 is connected with the first end of the second switch K2, an emitter of the bias bipolar junction transistor Qp is connected with the second end of the second switch K2, and a base and a collector of the bias bipolar junction transistor Qp is connected to ground. The charging current source includes a first charging current source and a second charging current source. The first PTAT current source E1 serves as the first charging current source to charge the charging capacitor C when the third switch K3 is turned on, the second PTAT current source E2 serves as the second charging current source to charge the charging capacitor C when the fourth switch K4 is turned on. The first PTAT current is equal to the second PTAT current.

As shown in FIG. 4, in this embodiment, compared with the embodiment shown in FIG. 3, the reuse of the current source can be realized by adjusting specific connection positions of the first switch K1 and the second switch K2. That is, the first PTAT current source E1 is reused as the charging current source in the second phase (the second PTAT current source E2 is configured to output the second voltage U2 in the second phase), and the second PTAT current source E2 is reused as the charging current source in the first phase (the first PTAT current source E1 is configured to output the first voltage U1 in the first phase).

The embodiment shown in FIG. 4 differs from the embodiment shown in FIG. 3 in that, since it is needed to ensure that the duty-cycle-modulated output of the comparator is only determined by the first voltage U1 and the second voltage U2, it is necessary to ensure that the charging currents in the two phases are the same, therefore, in the modulation circuit shown in FIG. 4, the current I1 of the first PTAT current source E1 and the current I2 of the second PTAT current source E2 needs to be equal, which may be achieved based on a current mirror.

It should also be noted that, in both the embodiment shown in FIG. 3 and the embodiment shown in FIG. 4, generally, the first voltage U1 and the second voltage U2 may be numerically close to each other to optimize the circuit design. The first voltage U1, i.e. n·ΔVbe, can be adjusted by adjusting the magnitude of the resistance of the bias resistor Rp and/or the magnitude of the total current flowing through the bias resistor Rp.

Figure 5:
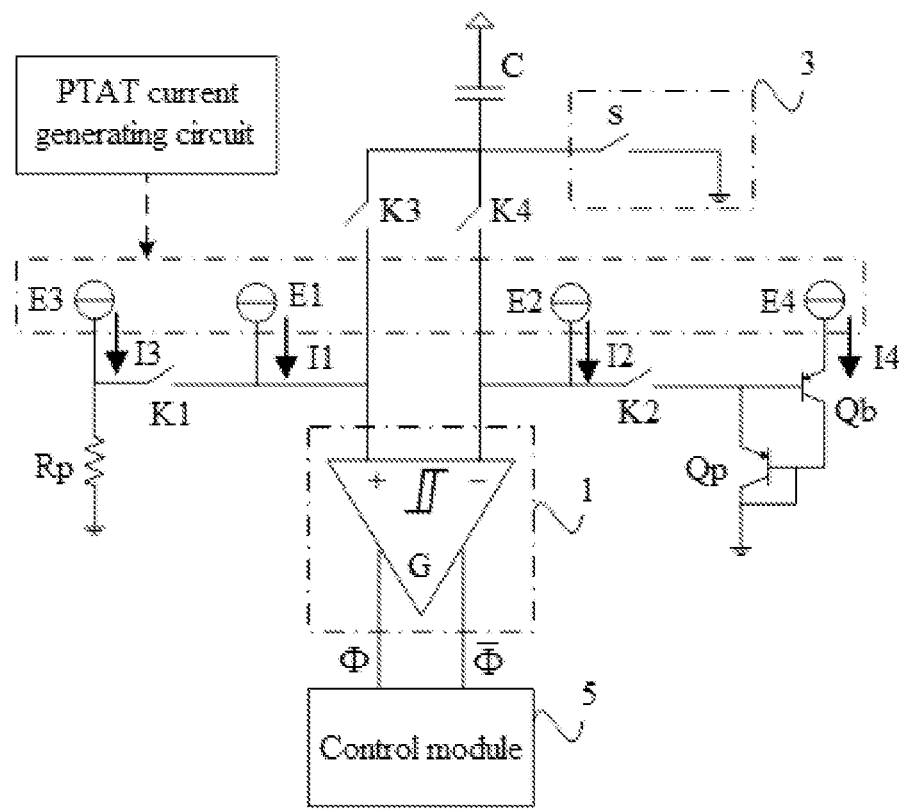
FIG. 5 is a circuit structural diagram of a temperature sensor according to another embodiment of the present disclosure.

Referring to FIGS. 5, FIG. 5 is a circuit structural diagram of a temperature sensor according to another embodiment of the present disclosure.

As a preferred embodiment, on basis of FIG. 4, in the temperature sensor provided in FIG. 5, the first voltage module further includes a third PTAT current source E3, and the third PTAT current source E3 is connected with the second end of the first switch K1.

As shown in FIG. 5, the third PTAT current source E3 is introduced in the embodiment, which achieves the purpose of increasing the total current flowing through the bias resistor Rp, and ensures that the charging current of the charging capacitor C in two phases are the same.

Preferably, the PTAT current generating circuit may provide the third PTAT current to the third PTAT current source E3 based on the current mirror. Those skilled in the art can select and set the magnitude of the third PTAT current I3 and the magnitude of the resistance of the bias resistor Rp according to the actual requirement, which is not limited in this disclosure. For example, it may be set as I3=4·I1=4·I2=4·I. The current I1 and the current I2 are two mirror currents outputted from the current mirror, and the current I3 can be obtained by connecting the four mirror currents outputted from the current mirror in parallel, I is the current of each mirror current.

In addition, as a preferred embodiment, on basis of FIG. 4, in the temperature sensor provided in FIG. 5, the second voltage module further includes a compensation bipolar junction transistor Qb and a compensation current source E4. The compensation current source E4 is connected with an emitter of the compensation bipolar junction transistor Qb. A collector of the compensation bipolar junction transistor Qb is connected to ground, a base of the compensation bipolar junction transistor Qb is connected with the emitter of the bias bipolar junction transistor Qp. The compensation bipolar junction transistor Qb is configured to perform gain compensation on the bias bipolar junction transistor Qp.

In an embodiment, as shown in FIG. 5, the actual gain of the bias bipolar junction transistor Qp may be compensated to increase by introducing the compensation bipolar junction transistor Qb. The compensation current I4 of the compensation current source E4 is preferably set to be equal to the current I2 of the second PTAT current source E2 (a deviation is acceptable), that is, I4=I2=4·I, the PTAT current generating circuit may also be preferably configured to provide a compensation current I4 to the compensation current source E4 based on the current mirror.

Figure 6:
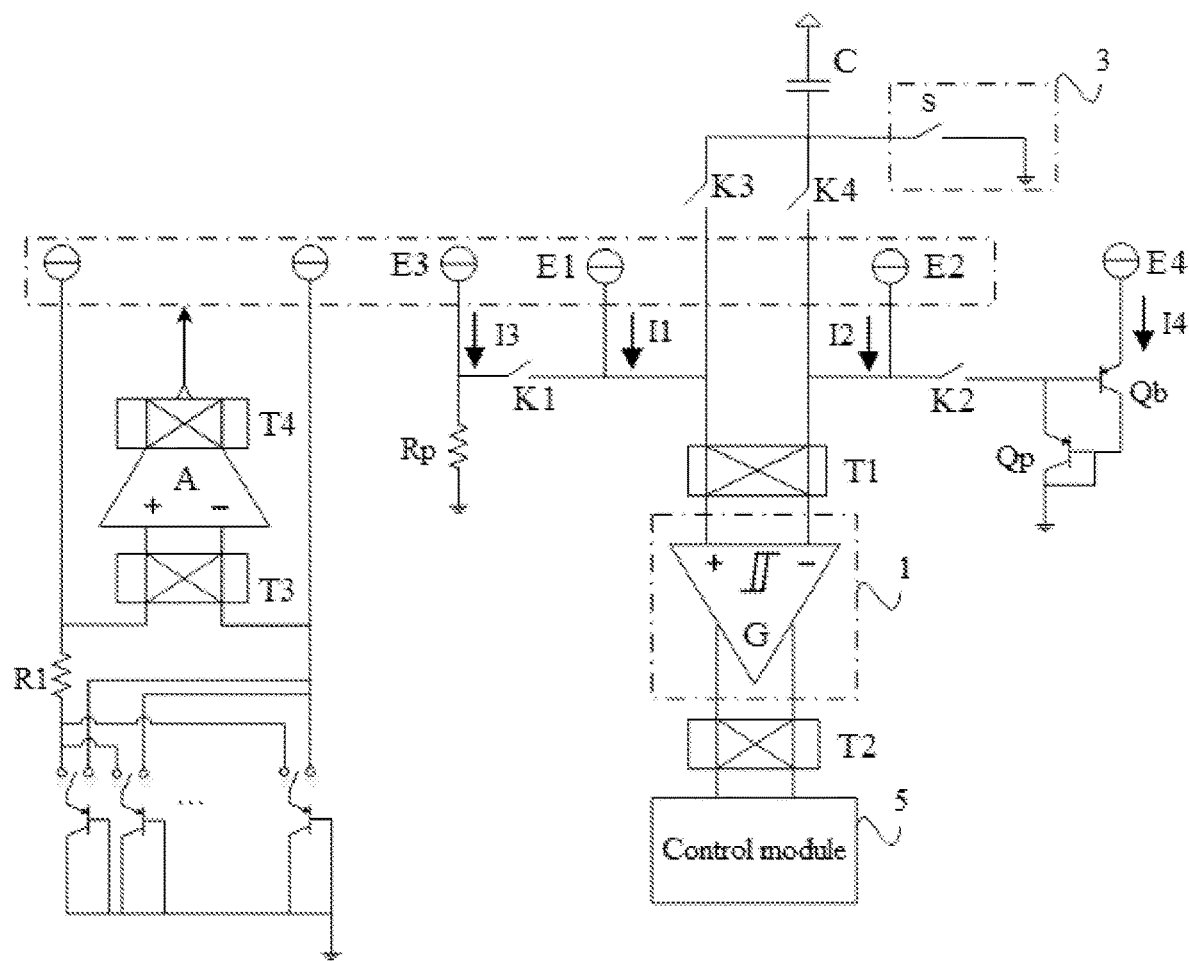
FIG. 6 is a circuit structural diagram of a temperature sensor according to another embodiment of the present disclosure.

Referring to FIG. 6, FIG. 6 is a circuit structural diagram of a temperature sensor according to another specific embodiment of the present disclosure.

In a preferred embodiment shown in FIG. 6, the PTAT current generating circuit includes a current mirror module, an operational amplifier A, a first resistor R1, a first predetermined number of first transistors Q1, and a second predetermined number of second transistors Q2.

A first end of the first resistor R1 is connected with a non-inverting input end of the operational amplifier A and is configured to receive a first mirror current outputted from the current mirror module; a second end of the first resistor R1 is connected with an emitter of each of the first transistors Q1.

An emitter of each of the second transistors Q2 is connected with an inverting input end of the operational amplifier A and is configured to receive a second mirror current outputted from the current mirror module. A base and a collector of each of the first transistors Q1 are connected to ground, a base and a collector of each of the second transistors Q2 are connected to ground. The current mirror module is configured to provide the first PTAT current and the second PTAT current.

It should be noted that the "first" and "second" in the "first transistor" and the "second transistor" used herein are aimed to distinguish the transistors at different connection positions, rather than referring to one specific transistor. The "first transistor" refers to a transistor whose emitter is connected to the first resistor R1, and the "second transistor" refers to a transistor whose emitter is connected to the inverting input end of the operational amplifier A.

As described above, the difference value between the base-emitter voltages of the transistor in different circuit states is positively correlated with temperature. The difference value ΔVbe may be realized by different numbers of transistors with the same type or by the size areas of transistors with different types. For the purpose of improving the accuracy, as shown in FIG. 6, the first transistor Q1 and the second transistor Q2 having the same size, i.e., the same type, may be selected, and the first predetermined number of the first transistors Q1 is set to be different from the second predetermined number of the second transistors Q2.

A person skilled in the art may select and set the first predetermined number and the second predetermined number according to actual application situations. For example, the ratio of the first predetermined number to the second predetermined number may be 8:1.

In a preferred embodiment shown in FIG. 6, the comparison module 1 further includes a first chopper T1 configured to chop an input signal of the comparator G, and a second chopper T2 configured to chop an output signal of the comparator G. The PTAT current generating circuit further includes a third chopper T3 configured to chop an input signal of the operational amplifier A, and a fourth chopper T4 configured to chop an output signal of the operational amplifier. The control module 5 is further configured to generate a chopping control clock signal according to the comparison result signal and output the chopping control clock signal to the first chopper T1, the second chopper T2, the third chopper T3 and the fourth chopper T4.

As described above, the technical effect of the present disclosure is not affected when replacing the connection position of the non-inverting input end and the inverting input end of the comparator G and adjusting accordingly the control signal of the switch module 4. Therefore, in order to eliminate the difference caused by different device structures and further improve the accuracy of the detection result, the temperature sensor provided in the present disclosure may further perform a chopping process on the signal related to the comparator G. That is, according to the chopper control clock signal, the connection position of the non-inverting input end and the inverting input end of the comparator G are alternately replaced through the first chopper T1, and the connection position of the output end of the $\Phi$ signal and the output end of the $\overline{\Phi}$ signal are alternately replaced through the second chopper T2. As for the operational amplifier A, the specific situation is similar to the comparator G, and is not described here.

In a preferred embodiment shown in FIG. 6, the PTAT current generating circuit further includes a second switching switch group connected with the current mirror module and a first switching switch group. The second end of the first resistor R1 is connected with the emitters of the first transistors Q1 via the first switching switch group. The inverting input end of the operational amplifier A is connected with the emitters of the second transistors Q2 via the first switching switch group. The control module 5 is further configured to generate a dynamic element matching (DEM) control clock signal according to the comparison result signal and output the DEM control clock signal to the first switching switch group and the second switching switch group, to perform dynamic element matching control on the first transistors Q1, the second transistors Q2 and the current mirror module.

In a CMOS circuit design with a high accuracy, the mismatch between elements is an important reason for generating errors and affecting accuracy. Considering that the element mismatch between the first transistor Q1 and the second transistor Q2 may cause the gain error in the current mirror module and the offset voltage of the operational amplifier A, in order to restrain the error and improve the detection accuracy, and the dynamic element matching (DEM) control may be introduced in the present embodiment.

As described above, the first transistors Q1 has the same type and size as the second transistors Q2, the number of the first transistors is the first predetermined number, and the number of the second transistors is the second predetermined number. In this embodiment, the first switching switch group including multiple switching switches may be arranged in the PTAT current generating circuit, the number of the switching switches is a sum of the first predetermined number and the second predetermined number. The emitter of each of the first transistors Q1 or the second transistors Q2 are connected to a movable end of one switching switch, and two fixed ends of each switching switch are connected with a second end of the first resistor R1 and the inverting input end of the operational amplifier A, respectively. With the control of the control module 5, the movable end of each switching switch can be connected to one of two fixed ends of the switching switch. Thereby, the control module 5 can timely control the switching switch to perform the switching operation and replace the first transistor and the second transistor according to the DEM control clock signal. Of course, the number of the first transistors Q1 and the number of the second transistors Q2 are always needed to be constant during the dynamic element matching control process.

Similarly, in order to restrain the gain error in the current mirror module, the dynamic element matching control may also be performed on each mirror current output of the current mirror module in this embodiment. Specifically, the PTAT current generating circuit requires two mirror currents. In the case of I3=4·I1=4·I2=4·I, each of I1 and I2 requires one mirror current, and I3 requires four mirror currents. Therefore, eight mirror currents are needed in total. Therefore, dynamic element matching control can be performed for each group of eight periods of the comparison result signal $\Phi$.

For the specific implementation of the temperature sensor provided in the present disclosure, the modulation circuit for voltage to duty-cycle conversion described above may be referred, which is not described herein.

Various embodiments of the present disclosure are described in a progressive manner, and each embodiment lays emphasis on differences from other embodiments. For the same or similar parts between the embodiments, one may refer to description of other embodiments.

It should be further noted that the relationship terminologies such as "first", "second" and the like are only used herein to distinguish one entity or operation from another, rather than to necessitate or imply that the actual relationship or order exists between the entities or operations. In addition, terms "comprising", "including", or any other variant thereof are intended to encompass a non-exclusive inclusion such that processes, articles, or devices that include a series of elements include not only those elements but also those that are not explicitly listed or other elements that are inherent to such processes, articles, or devices. Without limiting more, the elements defined by the statement "comprising one . . . " do not exclude that there are other identical elements in the process, article, or device that includes said elements.

The technical solution according to the present disclosure is described in detail herein. Although specific embodiments are described for explaining the principle and implementation of the present disclosure, the description of the embodiments is only for facilitating understanding core idea of the present disclosure. It should be noted that, for those skilled in the art, a few of modifications and improvements may be made to the present disclosure without departing from the principle of the present disclosure, and these modifications and improvements also fall into the scope of protection of the present disclosure.

The invention claimed is:

1. A modulation circuit for voltage to duty-cycle conversion, comprising:
   a comparison module comprising a comparator;
   a charging module comprising a charging capacitor and a charging current source;
   a grounding reset module;
   a switch module comprising a first switch, a second switch, a third switch and a fourth switch; and
   a control module; wherein
   a first input end of the comparator is connected with a first end of the first switch, a second end of the first switch is supplied with a first voltage; a second input end of the comparator is connected with a first end of the second switch, a second end of the second switch is supplied with a second voltage; an output end of the comparator serves as an output end of the modulation circuit, the output end of the comparator is configured to output a comparison result signal; a charging end of the charging capacitor is connected with the charging current source and the grounding reset module, the charging end of the charging capacitor is connected with the first input end of the comparator via the third switch, and the charging end of the charging capacitor is connected with the second input end of the comparator via the fourth switch; and the control module is configured to, when the comparison result signal flips over, control the grounding reset module to operate to make the charging capacitor be connected to ground and be reset, and switch an on-off state of a first switch group and an on-off state of a second switch group, wherein the first switch group comprises the first switch and the fourth switch, and the second switch group comprises the second switch and the third switch.

2. The modulation circuit according to claim 1, wherein the first input end of the comparator is a non-inverting input end, and the second input end of the comparator is an inverting input end; and the control module is configured to control the on-off state of the first switch group according to the comparison result signal, and control the on-off state of the second switch group according to an inverting signal of the comparison result signal.

3. A temperature sensor, comprising a temperature correlated voltage generating circuit and the modulation circuit for voltage to duty-cycle conversion according to claim 1, wherein the temperature correlated voltage generating circuit comprises:
a first voltage module configured to output the first voltage; and
a second voltage module configured to output the second voltage,
wherein the first voltage is positively correlated with temperature, the second voltage is negatively correlated with temperature; and
the control module is further configured to generate a temperature detection signal according to a duty-cycle of the comparison result signal and output the temperature detection signal.

4. The temperature sensor according to claim 3, wherein the control module is configured to generate a temperature detection signal µ according to $$\mu = \frac{kD}{kD + 1 - D}$$

and output the temperature detection signal; wherein D is the duty-cycle of the comparison result signal, and k is an adjustment parameter.

5. The temperature sensor according to claim 3, wherein the first voltage module comprises a first Proportional to Absolute Temperature (PTAT) current source and a bias resistor connected in series, wherein the first voltage is a voltage across two ends of the bias resistor;
the second voltage module comprises a second PTAT current source and a bias bipolar junction transistor connected in series, wherein the second voltage is a base-emitter voltage of the bias bipolar junction transistor; and the temperature correlated voltage generating circuit further comprises a PTAT current generating circuit configured to provide a first PTAT current for the first PTAT current source and provide a second PTAT current for the second PTAT current source.

6. The temperature sensor according to claim 5, wherein the first PTAT current source is connected with a first end of the bias resistor and the second end of the first switch, and a second end of the bias resistor is connected to ground; and
the second PTAT current source is connected with an emitter of the bias bipolar junction transistor and the second end of the second switch, and a base and a collector of the bias bipolar junction transistor are connected to ground.

7. The temperature sensor according to claim 5, wherein the first PTAT current source is connected with the first end of the first switch, a first end of the bias resistor is connected with the second end of the first switch, and a second end of the bias resistor is connected to ground;
the second PTAT current source is connected with the first end of the second switch, an emitter of the bias bipolar junction transistor is connected with the second end of the second switch, and a base and a collector of the bias bipolar junction transistor is connected to ground; and
the charging current source comprises a first charging current source and a second charging current source, and the first PTAT current source serves as the first charging current source to charge the charging capacitor when the third switch is turned on, the second PTAT current source serves as the second charging current source to charge the charging capacitor when the fourth switch is turned on, wherein the first PTAT current is equal to the second PTAT current.

8. The temperature sensor according to claim 7, wherein the first voltage module further comprises a third PTAT current source connected with the second end of the first switch.

9. The temperature sensor according to claim 7, wherein the second voltage module further comprises a compensation bipolar junction transistor and a compensation current source; wherein the compensation current source is connected with an emitter of the compensation bipolar junction transistor; a collector of the compensation bipolar junction transistor is connected to ground, a base of the compensation bipolar junction transistor is connected with the emitter of the bias bipolar junction transistor, the compensation bipolar junction transistor is configured to perform gain compensation on the bias bipolar junction transistor.

10. The temperature sensor according to claim 5, wherein the PTAT current generating circuit comprises a current mirror module, an operational amplifier, a first resistor, a first predetermined number of first transistors, and a second predetermined number of second transistors;
a first end of the first resistor is connected with a non-inverting input end of the operational amplifier and is configured to receive a first mirror current outputted from the current mirror module; a second end of the first resistor is connected with an emitter of each of the first transistors; and
an emitter of each of the second transistors is connected with an inverting input end of the operational amplifier and is configured to receive a second mirror current outputted from the current mirror module; a base and a collector of each of the first transistors are connected to ground, a base and a collector of each of the second transistors are connected to ground; the current mirror module is configured to provide the first PTAT current and the second PTAT current.

11. The temperature sensor according to claim 10, wherein the comparison module further comprises a first chopper configured to chop an input signal of the comparator, and a second chopper configured to chop an output signal of the comparator;

the PTAT current generating circuit further comprises a third chopper configured to chop an input signal of the operational amplifier, and a fourth chopper configured to chop an output signal of the operational amplifier; and the control module is further configured to generate a chopping control clock signal according to the comparison result signal and output the chopping control clock signal to the first chopper, the second chopper, the third chopper and the fourth chopper.

12. The temperature sensor according to claim 11, wherein the PTAT current generating circuit further comprises a second switching switch group connected with the current mirror module and a first switching switch group; the second end of the first resistor is connected with the emitters of the first transistors via the first switching switch group; the inverting input end of the operational amplifier is connected with the emitters of the second transistors via the first switching switch group; and the control module is further configured to generate a dynamic element matching (DEM) control clock signal according to the comparison result signal and output the DEM control clock signal to the first switching switch group and the second switching switch group, to perform dynamic element matching control on the first transistors, the second transistors and the current mirror module.

* * * * *